United States Patent [19]

Yamamoto et al.

[11] Patent Number: 5,536,293
[45] Date of Patent: Jul. 16, 1996

[54] BASE METAL COMPOSITION FOR EXTERNAL ELECTRODE OF MULTILAYER ELECTRONIC COMPONENT

[75] Inventors: Mika Yamamoto; Masaki Fujiyama; Yukio Sanada; Kunihiko Hamada, all of Nagaokakyo, Japan

[73] Assignee: Murata Manufacturing Co., Ltd.

[21] Appl. No.: 318,186

[22] Filed: Oct. 5, 1994

[30] Foreign Application Priority Data

Oct. 7, 1993 [JP] Japan .................................. 5-251490

[51] Int. Cl.$^6$ .......................... C22C 9/04; C22C 32/00
[52] U.S. Cl. ........................ 75/255; 204/292; 252/512; 252/518; 420/477
[58] Field of Search ........................ 75/233, 234, 235, 75/255; 420/477; 204/290, 291, 292; 252/512, 518

[56] References Cited

U.S. PATENT DOCUMENTS

| | | | |
|---|---|---|---|
| 4,756,754 | 7/1988 | SinghDeo | 75/235 |
| 4,810,420 | 3/1989 | Prabho et al. | 252/512 |
| 5,336,301 | 8/1994 | Tani et al. | 252/512 |
| 5,418,193 | 5/1995 | Tani et al. | 252/512 |

FOREIGN PATENT DOCUMENTS 4-95307  3/1992  Japan .

*Primary Examiner*—George Wyszomerski
*Attorney, Agent, or Firm*—Ostrolenk, Faber, Gerb & Soffen

[57] ABSTRACT

A base metal composition for forming an external electrode of a multilayer electronic component contains 70 to 85 percent by weight of Cu, 2 to 10 percent by weight of glass frit and 10 to 28 percent by weight of an organic vehicle. The glass frit contains at least one of lead zinc borosilicate and zinc borosilicate, Ba-Si based glass, and Zn which is in a range of less than 10 percent by weight in terms of ZnO.

11 Claims, No Drawings

BASE METAL COMPOSITION FOR EXTERNAL ELECTRODE OF MULTILAYER ELECTRONIC COMPONENT

BACKGROUND OF THE INVENTION

1. Field of the Invention

The present invention relates to a base metal composition for forming an external electrode of a multilayer electronic component such as a multilayer capacitor, for example, and more particularly, it relates to a base metal composition for an external electrode containing Cu as a main component.

2. Description of the Background Art

The material for an internal electrode of a multilayer capacitor is generally prepared from Ag or Ag-Pd. However, such an internal electrode material is high-priced. Therefore, an attempt has been made on employment of Ni, being a base metal, as a material which is at a lower cost.

On the other hand, an external electrode of such a multilayer capacitor is structured by forming a second electrode layer by plating Ni on a first electrode layer of Ag having excellent conductivity which can be baked at a low temperature, and further forming a third electrode layer of Sn or solder for improving solderability.

However, when the internal electrode is made of Ni, it and Ag are not solidly soluble with each other. When the internal electrode is made of Ni, therefore, it may be impossible to attain desired electrostatic capacity since the internal electrode cannot be reliably connected with the first electrode layer, which is made of Ag, forming the external electrode.

Therefore, attention is drawn to an external electrode consisting of Cu, which is entirely solidly soluble with respect to Ni. However, Cu is so easily oxidized that it is necessary to bake Cu conductive paste under a reducing atmosphere in order to prepare an external electrode. Under the reducing atmosphere, however, an organic substance which is contained in the Cu paste is decomposed at a low speed due to low oxygen concentration. Thus, glass contained in the Cu paste is melted, leading to foaming of a gas which is generated by decomposition of an organic substance incorporated in the melted glass upon further progress in sintering of Cu. Consequently, a phenomenon called blistering may be caused by such foaming, to partially swell the external electrode. When such blistering takes place, conductivity of the external electrode is reduced while it may not be possible to attain sufficient bond strength when the external electrode is electrically connected with another element or conductive pattern.

The aforementioned blistering may also be caused by reaction between ceramics and glass.

Japanese Patent Laying-Open No. 4-95307 (1992) proposes that the aforementioned blistering can be suppressed by employing Cu paste containing 5 to 15 percent by weight of lead zinc borosilicate glass frit and 2 to 5 percent by weight of zinc borosilicate glass frit having a crystallization temperature of 600° to 750° C.

When the Cu paste described in the above prior art is baked at a temperature exceeding 800° C. in a reducing atmosphere, however, the surface of the external electrode may be partially covered with glass due to the considerably large blending ratios of the glass frit materials, and hence solder wettability may be reduced or it may not be possible to form a plating layer on the external electrode.

SUMMARY OF THE INVENTION

An object of the present invention is to provide a base metal composition for an external electrode of a multilayer electronic component, which hardly causes blistering and enables efficient performance of solder plating or the like.

The present invention is directed to a base metal composition for an external electrode of a multilayer electronic component, which contains 70 to 85 percent by weight of Cu, 2 to 10 percent by weight of glass frit and 10 to 20 percent by weight of an organic vehicle. The glass frit contains at least one of lead zinc borosilicate and zinc borosilicate, Ba-Si based glass, and Zn which is in a range of less than 10 percent by weight in terms of ZnO.

The Ba-Si based glass can be properly prepared from that generally employed for glass frit for conductive paste, such as that containing BaO, $SiO_2$, CaO and $LiO_2$, for example. In more concrete terms, the Ba-Si based glass may be prepared from glass frit containing BaO, SiOn, CaO and $LiO_2$ in weight ratios of 30:40:20:10.

The organic vehicle employed in the present invention can be prepared from a well-known organic vehicle which is generally employed for forming conductive paste for an external electrode of a multilayer electronic component, such as that containing acrylic resin, for example.

In order to attain the aforementioned object, the inventors have prepared various Cu paste materials while reducing glass contents and studied the same, to discover that it is possible to form conductive paste which can be baked on a ceramic sintered body in an excellent state with no blistering, by employing glass frit which is prepared by blending Ba-Si based glass in a specific ratio with respect to at least one of lead zinc borosilicate glass and zinc borosilicate glass with a Zn content of the aforementioned specific ratio.

Namely, the feature of the present invention resides in that the blending ratio of the glass frit is reduced by employment of the glass frit of the aforementioned specific composition. Thus, it is possible to prevent the electrode from being covered with glass and from reduction in solder wettability and plating adhesion.

According to the present invention, therefore, the amount of the glass frit can be reduced as compared with the prior art due to the aforementioned specific composition. Thus, it is possible to form an external electrode having excellent solder wettability and plating adhesion, whose surface is reliably made of Cu, i.e., a conductive material.

The foregoing and other objects, features, aspects and advantages of the present invention will become more apparent from the following detailed description of the present invention.

DESCRIPTION OF THE PREFERRED EMBODIMENTS

Nonrestrictive Example of the present invention is now described, to clarify the present invention.

Ceramic sintered bodies, each having a length of 2 mm and a width of 1.25 mm with a plurality of internal electrodes stacked in its interior through ceramic layers, were prepared for forming chip-type multilayer capacitors. The ceramic sintered bodies were coated with the following Cu paste materials and baked to form multilayer capacitors, which were 1.2 µF in design capacity.

20 types of Cu paste samples Nos. 1 to 20 were prepared as shown in Table 1.

In each of the samples Nos. 1 to 10 shown in Table 1, glass frit was prepared by mixing Ba-Si based glass frit containing BaO, $SiO_2$, CaO and $LiO_2$ in ratios of 30:40:20:10 and was mixed into lead zinc borosilicate ($PbO-B_2O_3-SiO_2-ZnO$) in a weight ratio of 2:1. In these samples, ZnO was added to the lead zinc borosilicate glass frit in different ratios as shown in Table 1.

In each of the Cu paste samples Nos. 1 to 10, the glass frit was blended in a ratio of 5 or 12 percent by weight as shown in Table 1, with a content of 25 percent by weight of an acrylic organic vehicle and the balance was Cu powder.

On the other hand, each of the Cu paste samples Nos. 11 to 20 was prepared from glass frit containing zinc borosilicate $B_2O_2$-$SiO_2$-ZnO and the same Ba-Si based glass frit as the above in a weight ratio of 2:1. In these samples, the ZnO contents in the zinc borosilicate glass frit were made to differ from each other as shown in Table 1. Further, each of the Cu paste samples Nos. 11 to 20 contained 5 or 12 percent by weight of the glass frit, 25 percent by weight of a cellulose based organic vehicle, and the rest being Cu powder.

In each glass frit, ZnO was added to glass which was in a base composition, so that the glass frit of the sample No. 4 contained 98 percent by weight of zinc borosilicate glass and 2 percent by weight of ZnO, for example. The glass of the base composition and ZnO were melted at a temperature exceeding 1000° C., glassified and thereafter crushed, thereby preparing the aforementioned glass frit containing ZnO.

Alternatively, ZnO may be added as a raw material in preparation of the glass.

Each conductive paste having the aforementioned composition was baked onto both end surfaces of a sintered body chip for a multilayer capacitor in a nitrogen atmosphere having oxygen concentration of 50 ppm at a temperature of 800° C., for forming external electrodes.

Presence/absence of blistering was observed on surfaces of the external electrodes as provided on the multilayer capacitors. Table 1 shows the results.

Referring to Table 1, the term "blistering" indicates that of at least 50 μm in diameter caused on any external electrode. Each mark X shows a defective sample having two or more blisters on one external electrode.

On the other hand, Ni was electroplated on the surfaces of the external electrodes of each multilayer capacitor, for evaluating adhesion of the plating films as formed. The adhesion of the plating films was evaluated by electroplating Ni under conditions for forming plating films in thicknesses of 2 μm on electrodes containing no glass frit (in the case of the sample No. 1), and measuring thicknesses of the Ni plating films as formed. If the thickness is not more than 1 μm, solder heat resistance is unpreferably reduced due to an insufficient thickness of the plating film. Table 1 also shows the results.

Table 1 further shows values of insulation resistance (IR) of the multilayer capacitors as obtained.

TABLE 1

| Sample Number | Base Composition | Zn Content in Glass (wt %) | Frit Content in Paste (wt %) | Blistering | Adhesion of Plating Film (Ni Film) | IR Defective Ratio (%) n = 20 |
| --- | --- | --- | --- | --- | --- | --- |
| 1 | PbO—$B_2O_2$— | 0 | 5 | O | 2.0 | 20 |
| 2 | $SiO_2$— | 0 | 12 | O | 1.9 | 0 |
| 3 | (ZnO) | 2 | 5 | O | 2.2 | 0 |
| 4 | Lead | 2 | 12 | O | 0.5 | 0 |
| 5 | Zinc | 8 | 5 | O | 1.9 | 0 |
| 6 | Borosili | 8 | 12 | O | 0.4 | 0 |
| 7 | cate | 10 | 5 | O | 2.0 | 0 |
| 8 | | 10 | 12 | X | 0.5 | 0 |
| 9 | | 20 | 5 | X | 2.1 | 0 |
| 10 | | 20 | 12 | X | 0.4 | 0 |
| 11 | $B_2O_2$— | 8 | 5 | O | 2.2 | 0 |
| 12 | $SiO_2$—ZnO | 8 | 12 | O | 0.5 | 0 |
| 13 | Zinc | 10 | 5 | X | 2.0 | 0 |
| 14 | Borosili | 10 | 12 | X | 0.6 | 0 |
| 15 | cate | 20 | 5 | X | 2.1 | 0 |
| 16 | | 20 | 12 | X | 0.2 | 0 |
| 17 | | 30 | 5 | X | 1.9 | 0 |
| 18 | | 30 | 12 | X | 0.3 | 0 |
| 19 | | 40 | 5 | X | 2.1 | 0 |
| 20 | | 40 | 12 | X | 0.2 | 0 |

It is clearly understood from Table 1 that two or more blisters were caused on every external electrode in each of the samples Nos. 8 to 10 and 13 to 20 containing ZnO in excess of 10 percent by weight in the glass frit, and it was impossible to form excellent external electrodes in these samples.

Also as to the adhesion of the plating films, it is understood that the thickness of the Ni plating film was less than 2 μm with insufficient plating adhesion in each of the samples Nos. 2, 4, 6, 8, 10, 12, 14, 16, 18 and 20 containing the glass frit in excess of 10 percent by weight in the Cu paste.

On the other hand, the insulation resistance was so low that the multilayer capacitor was insufficient in withstand voltage in each of the samples Nos. 1 and 2 containing 0 percent by weight of ZnO.

When the Cu paste of each of the samples Nos. 3, 5, 7 and 11 which were within the scope of the present invention was employed, it was possible to form the Ni plating film in a sufficient thickness while substantially no failure was caused in insulation resistance, with no occurrence of two or more blisters on every external electrode.

While the above Example has been described with reference to formation of external electrodes of a multilayer capacitor, the base metal composition according to the present invention is applicable not only to a multilayer capacitor but to another multilayer ceramic electronic component such as a ceramic multilayer substrate having external electrodes of Cu.

Although the present invention has been described in detail, it is clearly understood that the same is by way of illustration and example only and is not to be taken by way of limitation, the spirit and scope of the present invention being limited only by the terms of the appended claims.

What is claimed is:

1. A base metal composition for an external electrode of a multilayer electronic component, containing 70 to percent by weight of Cu, 2 to 10 percent by weight of zinc-containing glass frit, and 10 to 28 percent by weight of an organic vehicle, wherein said glass frit is at least one of lead zinc borosilicate, zinc borosilicate or Ba-Si based glass, and the Zn content is less than 10 percent by weight calculated as ZnO.

2. A base metal composition for an external electrode of a multilayer electronic component in accordance with claim 1, wherein said frit is Ba-Si based glass and contains BaO, $SiO_2$, CaO and $LiO_2$.

3. A base metal composition for an external electrode of a multilayer electronic component in accordance with claim 2, wherein said organic vehicle contains acrylic resin.

4. A base metal composition for an external electrode of a multilayer electronic component in accordance with claim 2, wherein said glass frit contains said zinc borosilicate and said Ba-Si based glass in a weight ratio of 2:1.

5. A base metal composition for an external electrode of a multilayer electronic component in accordance with claim 2, wherein the zinc content is 2–8%.

6. A base metal composition for an external electrode of a multilayer electronic component in accordance with claim 1, wherein said organic vehicle contains acrylic resin.

7. A base metal composition for an external electrode of a multilayer electronic component in accordance with claim 6, wherein said glass frit contains said zinc borosilicate and said Ba-Si based glass in a weight ratio of 2:1.

8. A base metal composition for an external electrode of a multilayer electronic component in accordance with claim 6, wherein the zinc content is 2–8%.

9. A base metal composition for an external electrode of a multilayer electronic component in accordance with claim 1, wherein said glass frit contains said zinc borosilicate and said Ba-Si based glass in a weight ratio of 2:1.

10. A base metal composition for an external electrode of a multilayer electronic component in accordance with claim 9, wherein the zinc content is 2–8%.

11. A base metal composition for an external electrode of a multilayer electronic component in accordance with claim 1, wherein the zinc content is 2–8%.

* * * * *